(12) United States Patent
Choi

(10) Patent No.: US 7,642,803 B2
(45) Date of Patent: Jan. 5, 2010

(54) ADDRESS PIN REDUCTION MODE CIRCUIT WITH PARALLEL INPUT FOR SEMICONDUCTOR MEMORY DEVICE AND TEST METHOD USING THE SAME

(75) Inventor: Jong-Rok Choi, Gyeonggi-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 209 days.

(21) Appl. No.: 11/952,536

(22) Filed: Dec. 7, 2007

(65) Prior Publication Data

US 2008/0159030 A1      Jul. 3, 2008

(30) Foreign Application Priority Data

Jan. 3, 2007     (KR) .................... 10-2007-0000470

(51) Int. Cl.
*G01R 31/26* (2006.01)
(52) U.S. Cl. ...................... 324/765; 324/763
(58) Field of Classification Search ............... None
See application file for complete search history.

(56) References Cited

U.S. PATENT DOCUMENTS 6,977,516 B2    12/2005    Ferreira et al.
7,519,888 B2 *   4/2009    Tabatabaei et al. ........... 714/733

FOREIGN PATENT DOCUMENTS

KR      2004-0083695       10/2004

OTHER PUBLICATIONS

English language abstract of Korean Publication No. 2004-0083695.

* cited by examiner

*Primary Examiner*—Minh N Tang
(74) *Attorney, Agent, or Firm*—Stanzione & Kim LLP

(57) ABSTRACT

Example embodiments of the present invention include an address pin reduction mode circuit with parallel inputs and a method for testing a semiconductor memory device in an address pin reduction mode based on parallel input-based addressing. A reduction in the number of address pins is achieved by use of a common pin for address pins and data enable/disable pins in the semiconductor memory device. The address pin reduction mode circuit with parallel inputs for a semiconductor memory device is capable of reducing test costs by performing tests in an address pin reduction mode based on parallel input-based addressing, as opposed to serial addressing. Even when the semiconductor memory device has more address pins, example embodiments may include a first switch formed to include two address channels coupled to two channels of the tester. A second switch may be coupled to two data enable/disable pins having respective connections to the two channels of the tester. The first and second switches are structured to select the address and data enable/disable signals from the tester responsive to a mode register set (MRS) code corresponding to a test mode. A third switch may be configured to select a chip enable signal /CE and transmit the chip enable signal /CE to a data enable/disable channel responsive to the MRS code when the second switch is off. An address coding unit may be configured to provide a coded address to the two address channels responsive to the MRS code when the first switch is off.

14 Claims, 2 Drawing Sheets

ADDRESS PIN REDUCTION MODE CIRCUIT WITH PARALLEL INPUT FOR SEMICONDUCTOR MEMORY DEVICE AND TEST METHOD USING THE SAME

CROSS-REFERENCE TO RELATED APPLICATION

This application claims the benefit of Korean Patent Application No. 10-2007-0000470, filed Jan. 3, 2007, the disclosure of which is hereby incorporated by reference in its entirety.

BACKGROUND OF THE INVENTION

1. Technical Field

The present invention relates to an address pin reduction mode (APRM) circuit and method to test a semiconductor memory device, and more particularly, to an address pin reduction mode circuit based on parallel input-based addressing including a common pin for address pins and data enable/disable pins.

2. Discussion of Related Art

In general, a semiconductor device is fabricated on a wafer where various circuits are formed. The wafer is then divided into chips. Because chips are inherently weak and may be easily contaminated by external impurities, the chips are packaged. Prior to packaging, each chip must be tested by an internal circuit to check for normal operation. An enable signal is applied to a specific pad in order to put a given chip in a test mode. When it is determined that the chip is normal, the chip is then packaged.

A chip test technique is disclosed in a Korean patent Laid-open Publication No. 10-2004-0083695, which discloses a technique where a semiconductor memory device having a plurality of X addresses and a plurality of Y addresses is tested using a DQ-related (data) signal as some of the plurality of X addresses, so that the number of addresses required for testing is reduced.

Nevertheless, test systems for semiconductor memory devices are still limited in the number of signal channels which can be allocated to each device in a parallel test. As the size of semiconductor memory devices increases, so too does the number of pins on the memory device. The increase in the number of pins is due to address increase in the semiconductor memory device. And for each new pin, the number of memory devices that can be tested in parallel is inevitably reduced by ½. For example, when a semiconductor memory device has 20 pins, the test system can test 64 semiconductor memory devices. Whereas when a semiconductor memory device has 21 pins, the test system can test only 32 semiconductor memory devices. That is, the number of semiconductor memory devices that can be tested at a time is reduced from 64 to 32, e.g., by ½, which as a result, increases test costs. Thus, a variety of mode register set (MRS) modes for shortening a test time and increasing parallel test capacity can be used, such as a merged DQ mode (MDQ), an address pin reduction (APR) mode based on serial addressing, and a parallel bit test mode.

The MDQ mode suffers from a test coverage risk because only a limited number of input/output (I/O) data formats are available for each merged DQ. When a memory device is a multi chip package (MCP) product, the MDQ mode is not available in a package test process when other chips are in the MDQ mode and input/output (I/O) is unavailable. In addition, the MDQ mode does not guarantee an optimal user environment because of inconsistently set data pins.

The conventional address pin reduction (APR) mode implements address pin reduction based on serial addressing in which a parallel address is sent in serial. However, serial addressing increases address latch time, such that the intended cost reduction is thwarted.

The parallel bit test mode tests more bits simultaneously in order to shorten the test time and reduce the number of address pins. However, a test coverage issue arises as noise is generated due to simultaneous access to four or eight cells and the number of available input/output (I/O) data formats is reduced. Furthermore, the parallel bit access does not guarantee an optimal user environment based on single bit access.

Accordingly, a need remains for an improved address pin reduction mode circuit and method based on parallel input-based addressing to test a semiconductor memory device.

SUMMARY OF THE INVENTION

Example embodiments of the present invention include a semiconductor memory device capable of being coupled to a tester, the tester including a plurality of channels that are structured to transmit first to third signals, the memory device comprising: a first pair of pins capable of being coupled to the channels of the tester; a first switching device coupled to the first pair of pins and structured to select the first signal responsive to a mode register set (MRS) code; a second switching device coupled to the first pair of pins and structured to select the second signal responsive to the MRS code; a third switching device structured to select the third signal as the second signal in response to the MRS code when the second switching device is turned off; and an address coding unit structured to provide address coding data as the first signal in response to the MRS code when the first switching device is turned off.

Another example embodiment of the present invention includes a method for testing a semiconductor memory device capable of being coupled to a tester, the tester including a plurality of channels that are structured to transmit first to third signals, the method comprising: generating the first and second signals; selecting the first and second signals responsive to a mode register set (MRS) code; when the first signal is selected, selecting the third signal as the second signal in response to the MRS code; selecting the second signal responsive to the MRS code; and when the second signal is selected, generating and providing address coding data as the first signal in response to the MRS code.

The present invention will now be described more fully hereinafter with reference to the accompanying drawings, in which preferred embodiments of the invention are shown. This invention may, however, be embodied in many different forms and should not be construed as being limited to the example embodiments set forth herein. Rather, these example embodiments are provided so that this disclosure will be thorough and complete, and will fully convey the scope of the invention to those skilled in the art.

BRIEF DESCRIPTION OF THE DRAWINGS

The foregoing and other features, objects, and advantages of example embodiments of the present invention will become more readily apparent from the following detailed description, which proceeds with reference to the accompanying drawings in which.

DETAILED DESCRIPTION OF THE INVENTION

The present invention will now be described more fully hereinafter with reference to the accompanying drawings, in which preferred embodiments of the invention are shown. This invention may, however, be embodied in different forms and should not be construed as limited to the example embodiments set forth herein. Rather, these example embodiments are provided as teaching examples of the invention. Like numbers refer to like element.

Figure 1:
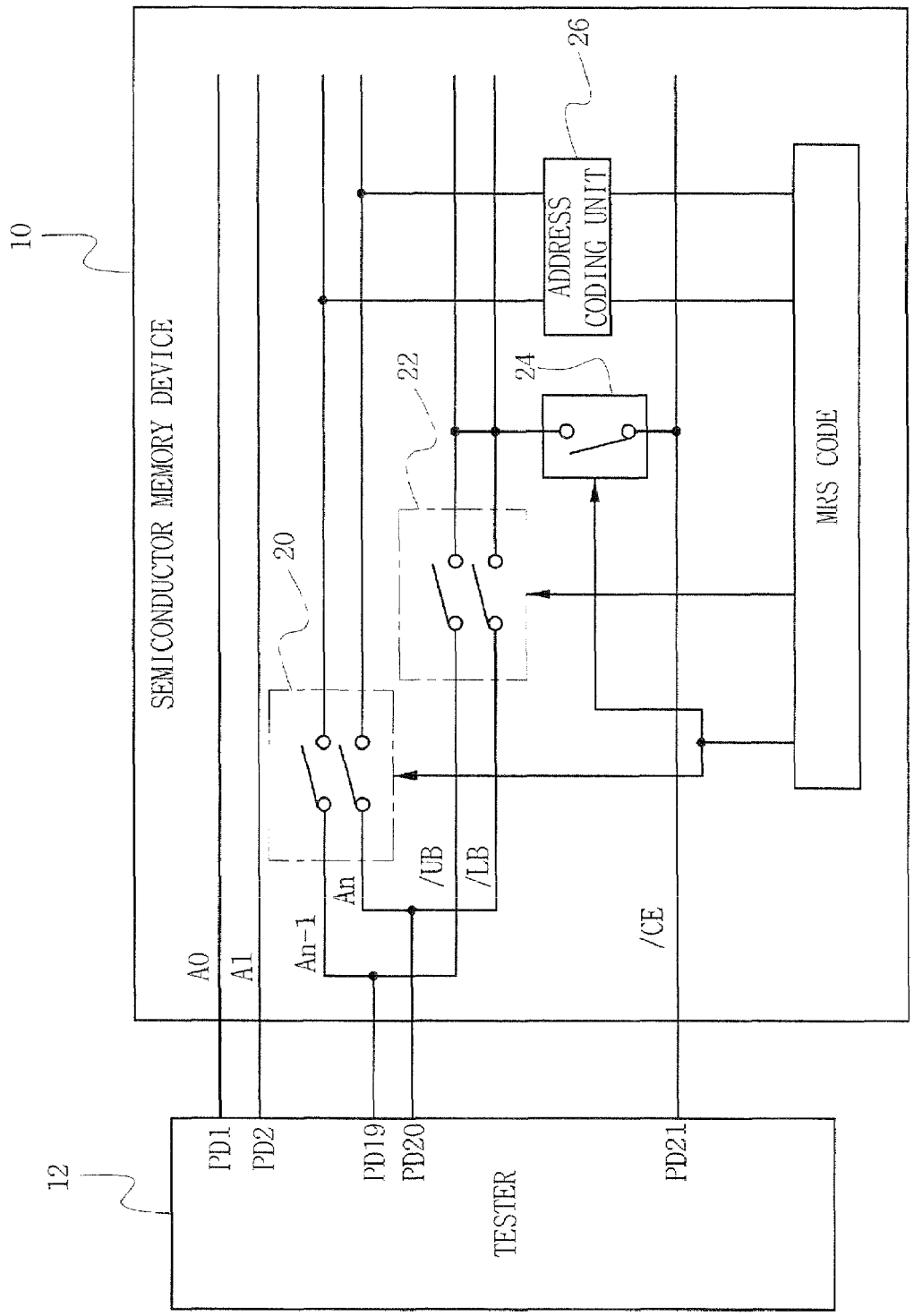
FIG. 1 shows a block diagram including a test system having a channel connection to test a semiconductor memory device according to an example embodiment of the present invention.

FIG. 1 shows a block diagram including a test system having a channel connection to test a semiconductor memory device according to an example embodiment of the present invention. A test system may include a semiconductor memory device 10 to store data, and a tester 12 having channels coupled to the semiconductor memory device 10 to test whether the semiconductor memory device 10 is defective. The tester 12 may selectively send address and data enable/disable signals to the semiconductor memory device 10 via two channels PD19 and PD20 to test the semiconductor memory device 10. The semiconductor memory device 10 may include a first switch 20 formed to include two address channels An-1 and An coupled to the two channels PD19 and PD20, respectively, of the tester 12. The address channels An-1 and An may be selected responsive to a first portion of a mode register set (MRS) code corresponding to a test mode. A second switch 22 may be coupled to a data enable/disable channel (configured to transmit upper /UB and lower /LB byte select signals) having respective connections to the two channels PD19 and PD20 of the tester 12. The enable/disable signals /UB and /LB may be selected responsive to a second portion of the MRS code corresponding to the test mode. A third switch 24 may be configured to select a chip enable signal /CE and transmit the chip enable signal /CE to the data enable/disable channel responsive to the first portion of the MRS code corresponding to the test mode when the second switch 22 is off (e.g., open). An address coding unit 26 may be configured to provide a coded address to the address channels An-1 and An responsive to third and fourth portions of the MRS code corresponding to the test mode when the first switch 20 is off (e.g., open).

Figure 2:
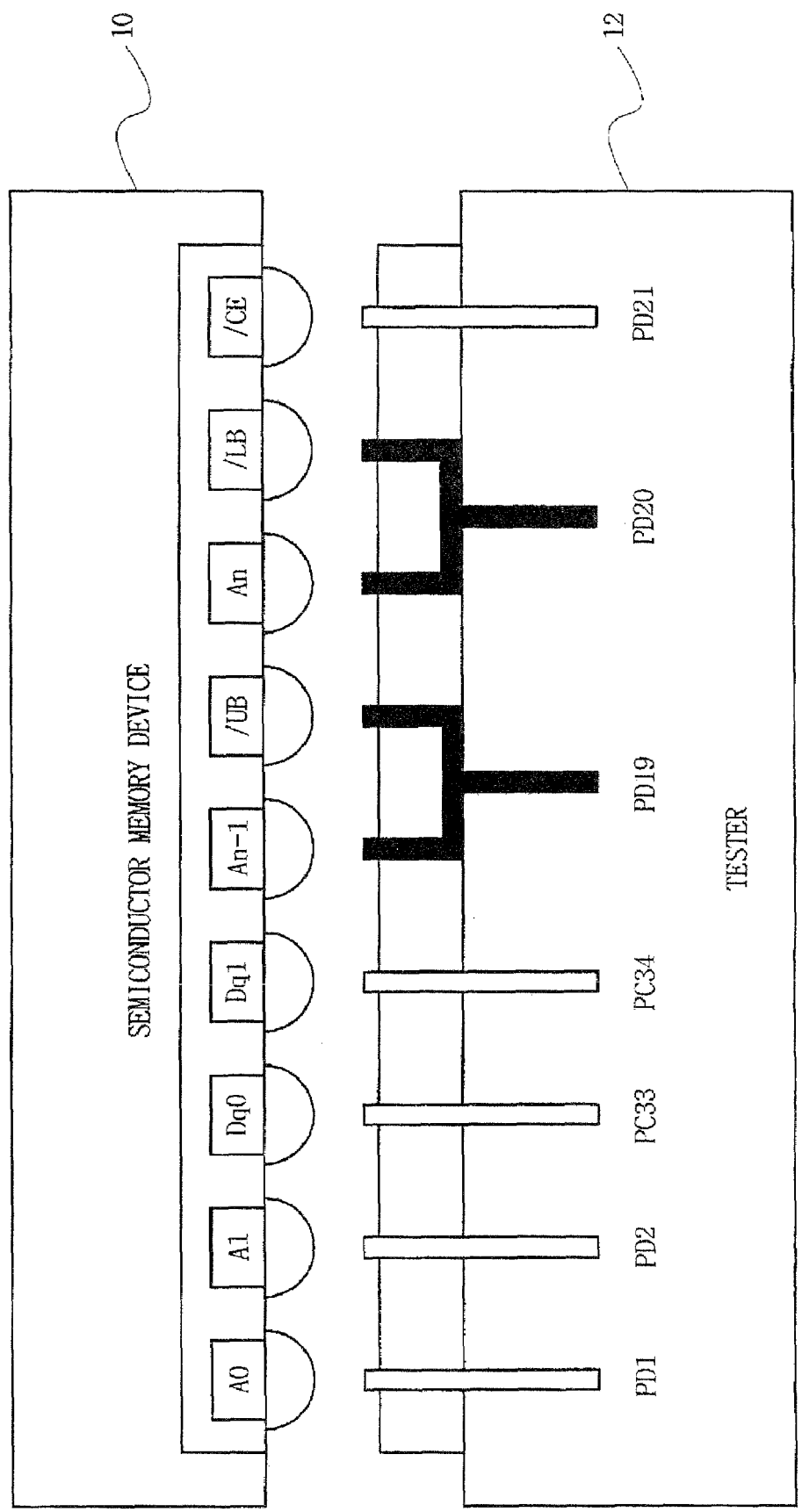
FIG. 2 shows a block diagram including a test system in which a data enable/disable channel (configured to transmit upper /UB and lower /LB byte select signals) and two address channels are merged between a tester and a semiconductor memory device according to an example embodiment of the present invention.

FIG. 2 shows a block diagram including a test system in which a data enable/disable channel (configured to transmit upper /UB and lower /LB byte select signals) and two address channels are merged between a tester and a semiconductor memory device according to an example embodiment of the present invention. Operation of the test system according to a preferred embodiment of the present invention will be described in detail with reference to FIGS. 1 and 2.

When power is on, the test system may be in a default mode in which the two address channels An-1 and An and the data enable/disable signals /UB and /LB are all properly set so as not to cause any problems in operation of the semiconductor memory device 10 in a user environment. In this mode, the tester 12 may not have an ability to perform a function test for a full area of the memory device 10. The tester 12 can perform a function test for ¼ of the area in which the address channels An-1 and An of the semiconductor memory device 10 are low when the data enable/disable signals /UB and /LB are low.

In a full area test mode for a cell defect check, the MRS code may be configured as 1000. Accordingly, the first switch 20 and the third switch 24 are on (e.g., closed) and the second switch 22 is off (e.g., open). As the first switch 20 is on, the address from the channels PD19 and PD20 of the tester 12 may be transmitted to the address channels An-1 and An of the semiconductor memory device 10. And as the second switch 22 is off and the third switch 24 is on, external signals from the channels PD19 and PD20 of the tester 12 may be blocked and the chip enable signal /CE from the third switch 24 may be transmitted as the data enable/disable signals /UB and /LB of the semiconductor memory device 10, such that the data enable/disable signals /UB and /LB are enabled. In this manner, as the signal from the channels PD19 and PD20 of the tester 12 is transmitted to the two address channels An-1 and An, and the chip enable signal is transmitted as the data enable/disable signals /UB and /LB over the data enable/disable channel, the full area function test for the semiconductor memory device 10 may be performed. In general, the upper/lower byte (/UB and /LB) enable signals may be the same as the chip enable signal /CE with respect to the device's operational characteristics in normal operation (as compared with a byte control/byte mask operation), which makes it possible to perform the test in the same environment as a user environment.

In a byte control/byte mask function test mode, the MRS code may be configured as 01XX. Accordingly, the first switch 20 and the third switch 24 are off (e.g., open) and the second switch 22 is on (e.g., closed). As the first switch 20 is off, the signal path from the channels PD19 and PD20 of the tester 12 to the address channels An-1 and An of the semiconductor memory device 10 may be blocked. Instead, a coded signal from the address coding unit 26 may be transmitted to the two address channels An-1 and An of the semiconductor memory device 10. As the second switch 22 is on, the external signal from the channels PD19 and PD20 of the tester 12 is transmitted as the data enable/disable signals /UB and /LB over the data enable/disable channel of the semiconductor memory device 10. In this manner, as the coded address from the address coding unit 26 is transmitted to the two address channels An-1 and An, and as the signal from the channels PD19 and PD20 of the tester 12 is configured to be the two data enable/disable signals /UB and /LB, a byte control/byte mask function test for the semiconductor memory device 10 may be performed. In this mode, the address from the tester 12 is not applied to the address channels An-1 and An; thus, ¾ area of the semiconductor memory device is not accessed. As a result, in the byte control/byte mask function test, a determination can be made as to whether the memory device is normal, based on only a partial area. Address coding may be performed through further configuration of the MRS code.

For example, when the MRS code is #0100, an address comprised of address channel An="Low" and address channel An-1="Low" may be transmitted by the address coding unit 26. Similarly, when the MRS code is #0101, an address comprised of address channel An="Low" and address channel An-1="High" may be transmitted by the address coding unit 26. And when the MRS code is #0110, an address comprised of address channel An="High" and address channel An-1="Low" may be transmitted by the address coding unit 26. Finally, when the MRS code is #0111, an address comprised of address channel An="High" and address channel An-1="High" may be transmitted by the address coding unit 26.

Example embodiments of the present invention may be characterized by the address pin reduction test mode using byte control pin-based addressing (e.g., not serial addressing). The APR test mode may accommodate the reduced number of channels of the package test system. When the number of available parallel pins is reduced due to increased density (e.g., when channels of the device are fully allocated), parallel channels can be obtained through the APR test mode—and the test can be performed in the same environment as a user environment, thus suppressing test coverage risk. In this test scenario, the byte control pin may be the data enable/disable pin.

When the semiconductor memory device belongs to a random access memory (RAM) series (e.g., Static Random Access Memory (SRAM), Uni-transistor Random Access Memory (UtRAM:/UB,/LB), or Dynamic Random Access Memory (DRAM:UDQM,LDQM), among others), the same address reduction mode can be implemented using byte select pins. When the semiconductor memory device belongs to a flash memory series, the same address reduction mode can be implemented using minor function clock pins (not shown), e.g., a write protect pin WP and a reset pin /RP. Here, the minor function clock pin may be used for a special function check. In normal operation, a fixed level may be applied to the minor function clock pins.

As described above, according to various example embodiments of the present invention, the address pin reduction test mode may be implemented using byte control pin-based addressing (e.g., not serial addressing) thereby allowing the test to be performed in the same environment as a user environment, and suppressing test coverage risk. In addition, even when the semiconductor memory device has more address pins, the test may be performed in the address pin reduction mode based on parallel input-based addressing, which decreases test costs.

The invention has been described using preferred example embodiments. However, it is to be understood that the scope of the invention is not limited to the disclosed embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

What is claimed is:

1. A semiconductor memory device capable of being coupled to a tester, the tester including a plurality of channels that are structured to transmit first to third signals, the memory device comprising:
    a pair of pins capable of being coupled to the channels of the tester;
    a first switching device coupled to the pair of pins and structured to select the first signal responsive to a mode register set (MRS) code;
    a second switching device coupled to the pair of pins and structured to select the second signal responsive to the MRS code;
    a third switching device structured to select the third signal as the second signal in response to the MRS code when the second switching device is turned off; and
    an address coding unit structured to provide address coding data as the first signal in response to the MRS code when the first switching device is turned off.

2. The device according to claim 1, wherein the MRS code corresponds to a test mode and the first and second signals are an address signal and a data enable/disable signal, respectively.

3. The device according to claim 1, wherein the third signal is a chip enable signal /CE.

4. The device according to claim 1, wherein if the semiconductor memory device belongs to a random access memory (RAM) series, the pair of pins includes at least one byte select pin.

5. The device according to claim 1, wherein if the semiconductor memory device belongs to a flash memory series, the pair of pins includes at least one minor function clock pin.

6. The device according to claim 5, wherein during a normal operation, a fixed level is applied to the at least one minor function clock pin.

7. A method for testing a semiconductor memory device capable of being coupled to a tester, the tester including a plurality of channels that are structured to transmit first to third signals, the method comprising:
    generating the first to third signals;
    selecting the first signal responsive to a mode register set (MRS) code;
    when the first signal is selected, selecting the third signal as the second signal in response to the MRS code;
    selecting the second signal responsive to the MRS code; and
    when the second signal is selected, generating and providing address coding data as the first signal in response to the MRS code.

8. The method according to claim 7, wherein the MRS code corresponds to a test mode and the first and second signals are an address signal and a data enable/disable signal, respectively.

9. The method according to claim 7, wherein the third signal is a chip enable signal /CE.

10. The method according to claim 7, wherein the MRS code has a value of 1000.

11. The method according to claim 7, wherein the MRS code has a value of 01XX.

12. The method according to claim 8, wherein if the semiconductor memory device belongs to a random access memory (RAM) series, the data enable/disable signal includes an upper byte select signal /UB and a lower byte select signal /LB.

13. The method according to claim 8, wherein if the semiconductor memory device belongs to a flash memory series, the data enable/disable signal includes minor function clock signals.

14. The method according to claim 13, wherein the minor function clock signals are a write protect signal WP and a reset signal /RP.

* * * * *